United States Patent
Ki

(10) Patent No.: US 9,983,999 B2
(45) Date of Patent: May 29, 2018

(54) COMPUTING SYSTEM WITH CACHE MANAGEMENT MECHANISM AND METHOD OF OPERATION THEREOF

(71) Applicant: Samsung Electronics Co., Ltd., Suwon-si, Gyeonggi-do (KR)

(72) Inventor: Yang Seok Ki, Palo Alto, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days. days.

(21) Appl. No.: 15/812,900

(22) Filed: Nov. 14, 2017

(65) Prior Publication Data

US 2018/0067863 A1 Mar. 8, 2018

Related U.S. Application Data

(63) Continuation-in-part of application No. 15/083,099, filed on Mar. 28, 2016, now Pat. No. 9,846,651.

(60) Provisional application No. 62/286,193, filed on Jan. 22, 2016.

(51) Int. Cl.
| | |
|---|---|
| *G06F 12/00* | (2006.01) |
| *G06F 12/0866* | (2016.01) |
| *G06F 12/0888* | (2016.01) |
| *G11C 16/16* | (2006.01) |
| *G06F 3/06* | (2006.01) |
| *G06F 12/122* | (2016.01) |
| *G06F 12/123* | (2016.01) |
| *G06F 12/02* | (2006.01) |
| *G11C 16/10* | (2006.01) |
| *G06F 12/08* | (2016.01) |

(52) U.S. Cl.
CPC ........ *G06F 12/0866* (2013.01); *G06F 3/0647* (2013.01); *G06F 12/0246* (2013.01); *G06F 12/0888* (2013.01); *G06F 12/122* (2013.01); *G06F 12/123* (2013.01); *G11C 16/102* (2013.01); *G11C 16/16* (2013.01); *G06F 12/08* (2013.01)

(58) Field of Classification Search
None
See application file for complete search history.

(56) References Cited

U.S. PATENT DOCUMENTS

| | | |
|---|---|---|
| 9,298,604 B2 | 3/2016 | Sengupta et al. |
| 9,742,863 B2 | 8/2017 | Guerin et al. |
| 2013/0097387 A1* | 4/2013 | Sanchez Martin . G06F 12/0862 711/129 |
| 2013/0282965 A1 | 10/2013 | Sengupta et al. |
| 2015/0242227 A1 | 8/2015 | Nair |
| 2016/0026392 A1 | 1/2016 | Harris et al. |
| 2016/0269502 A1 | 9/2016 | Guerin et al. |

(Continued)

*Primary Examiner* — Brian Peugh
(74) *Attorney, Agent, or Firm* — IP Investment Law Group

(57) ABSTRACT

A computing system includes: a memory storage unit, having memory blocks, configured as a memory cache to store storable objects; and a device control unit, coupled to the memory storage unit, configured to: calculate an entropy level for the storable objects based on an eviction policy; calculate a block entropy for each of the memory blocks based on the entropy level of the storable objects in the memory blocks; select an erase block from the memory blocks, wherein the erase block is an instance of the memory blocks with the lowest value of the block entropy; and perform an erase operation on the erase block.

20 Claims, 8 Drawing Sheets

(56) References Cited

U.S. PATENT DOCUMENTS

2016/0285996 A1\* 9/2016 Akhtar ................ H04L 67/1097
2017/0116130 A1 4/2017 Sundaravaradan et al.

\* cited by examiner

COMPUTING SYSTEM WITH CACHE MANAGEMENT MECHANISM AND METHOD OF OPERATION THEREOF

CROSS-REFERENCE TO RELATED APPLICATION

This application is a Continuation-in-Part to U.S. patent application Ser. No. 15/083,099 filed Mar. 28, 2016, now U.S. Pat. No. 9,846,651, and the subject matter thereof is incorporated herein by reference thereto. U.S. patent application Ser. No. 15/083,099 filed Mar. 28, 2016 now U.S. Pat. No. 9,846,651, further claims the benefit of U.S. Provisional Patent Application Ser. No. 62/286,193 filed Jan. 22, 2016, the subject matter thereof is incorporated herein by reference thereto.

TECHNICAL FIELD

An embodiment of the present invention relates generally to a computing system, and more particularly to a system for cache management.

BACKGROUND

Modern consumer and industrial electronics, especially cloud computing devices and web servers, are providing increasing levels of functionality to support modern life, including analysis of big data and real time web applications. Research and development in the existing technologies can take a myriad of different directions.

As users become more empowered with the growth of information processing technology, new and old paradigms begin to take advantage of this new space. One electronics based growth space, where processing high volumes of information is quintessential, is in big data analysis, such as with non-Structured Query Language ("NoSQL" or "Non-SQL") based systems. However, back end databases and computing servers, such as web caching servers, that host the information are costly and may become bottlenecks in throughput of the information. Thus, scalable data servers with high input/output per second (IOPS) throughput has eluded those of skill in the art.

Thus, a need still remains for a computing system with memory management mechanism for cache management. In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention provides a system including: a memory storage unit, having memory blocks, configured as a memory cache to store storable objects; and a device control unit, coupled to the memory storage unit, configured to: calculate an entropy level for the storable objects based on an eviction policy; calculate a block entropy for each of the memory blocks based on the entropy level of the storable objects in the memory blocks; select an erase block from the memory blocks, wherein the erase block is an instance of the memory blocks with the lowest value of the block entropy; and perform an erase operation on the erase block.

An embodiment of the present invention provides a method including: storing storable objects in memory blocks of a memory storage unit, the memory storage unit configured as a memory cache; calculating an entropy level for the storable objects based on an eviction policy; calculating a block entropy for each of the memory blocks based on the entropy level of the storable objects stored in the memory blocks; selecting an erase block from the memory blocks, wherein the erase block is an instance of the memory blocks with the lowest value of the block entropy, and performing an erase operation on the erase block.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

Figure 1:
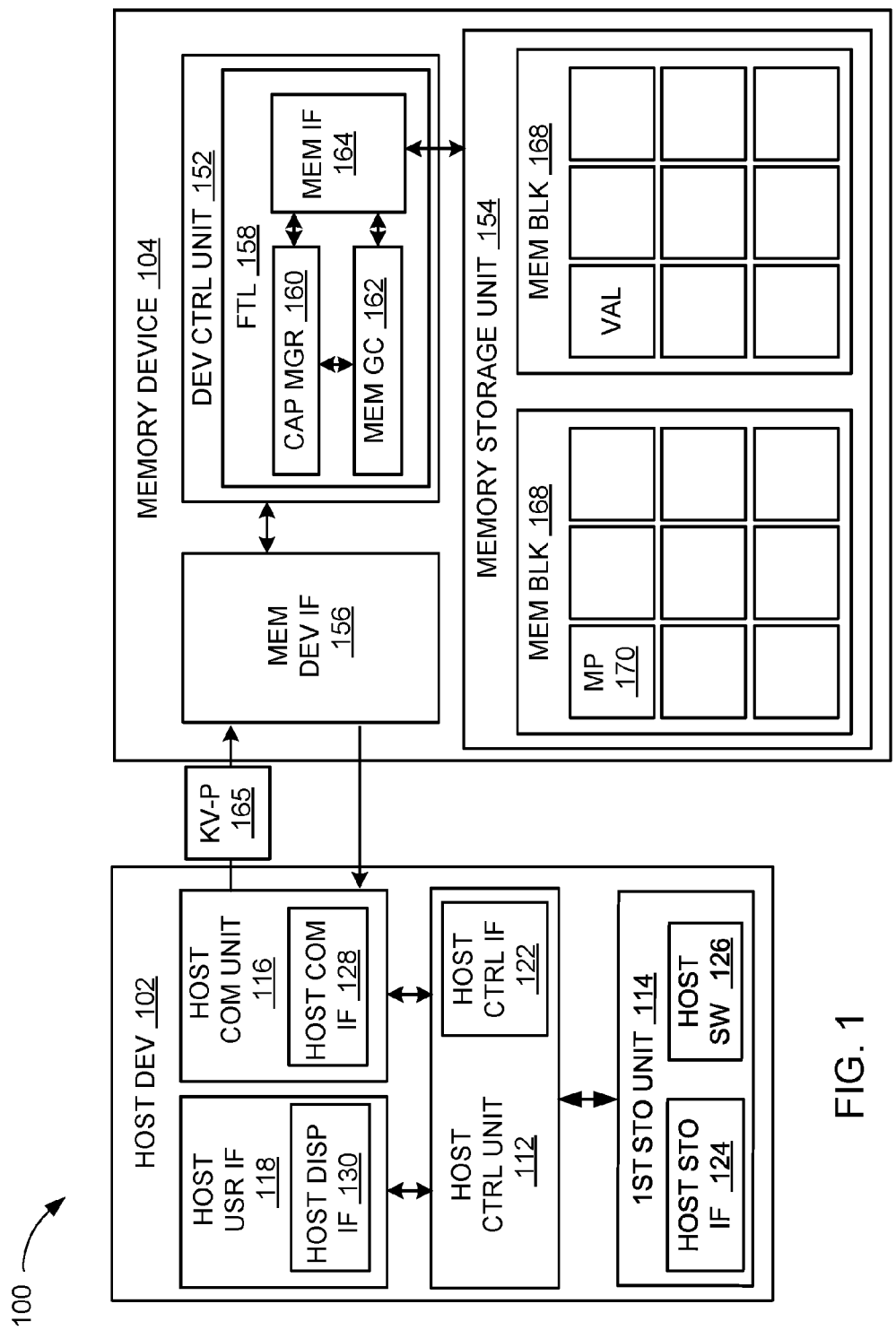
FIG. 1 is a computing system with cache management mechanism in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of an embodiment of the present invention.

In the following description, numerous specific details are given to provide a thorough understanding of the invention. However, it will be apparent that the invention may be practiced without these specific details. In order to avoid obscuring an embodiment of the present invention, some well-known circuits, system configurations, and process steps are not disclosed in detail.

The drawings showing embodiments of the system are semi-diagrammatic, and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, the invention can be operated in any orientation. The embodiments have been numbered first embodiment, second embodiment, etc. as a matter of descriptive convenience and are not intended to have any other significance or provide limitations for an embodiment of the present invention.

Referring now to FIG. 1, therein is shown a computing system 100 with a memory management mechanism in an embodiment of the present invention. FIG. 1 depicts an example block diagram of the computing system 100. The computing system 100 can include a host device 102 and a memory device 104. The block diagram depicts a memory device 104 coupled to a host device 102.

The host device 102 can be a computing device, such as a server, laptop computer, or desktop computer. In another example, the host device 102 can include a variety of centralized or decentralized computing devices. As a specific example, the host device 102 can be a grid-computing resources, a virtualized computer resource, cloud computing resource, peer-to-peer distributed computing devices, a web server, or a combination thereof.

The host device 102 can be a device capable of supporting or implementing a key-value store or database, such as NoSQL databases, and executing big data and real-time web applications, or a combination thereof.

The host device 102 can include units, such as hardware components, including a host control unit 112, a host storage unit 114, a host communication unit 116, and a host user interface 118. The host control unit 112 can include a host control interface 122. The host control unit 112 can execute a host software 126 to provide the intelligence of the host device 102.

The host control unit 112 can be implemented in a number of different manners of hardware circuitry. For example, the host control unit 112 can be a processor, such as a CPU, an application specific integrated circuit (ASIC), an embedded processor, a microprocessor, a hardware control logic, a hardware finite state machine (FSM), a digital signal processor (DSP), a programmable logic device (PLD) or a combination thereof. The host control unit 112 can include dedicated circuitry, such as a memory controller, memory chip controller, or memory controller unit, for memory allocation operations and flow of information.

The host control interface 122 can be used for communication between the host control unit 112 and other units in the host device 102. The host control interface 122 can also be used for communication that is external to the host device 102, including the memory device 104.

The host control interface 122 can receive information from the other units or from external sources, or can transmit information to the other units or to external destinations. The external sources and the external destinations refer to sources and destinations external to the host device 102.

The host control interface 122 can be implemented in different ways with hardware circuitry and can include different implementations depending on which internal units or external units are being interfaced with the host control interface 122. For example, the host control interface 122 can be implemented with a pressure sensor, an inertial sensor, a microelectromechanical system (MEMS), optical circuitry, waveguides, wireless circuitry, wireline circuitry, or a combination thereof.

The host storage unit 114 can store the host software 126. The host storage unit 114 can also store the relevant information, such as information related to objects, including information associated with the key-value pairs 165, stored on the host storage unit 114, the memory device 104, or a combination thereof.

The host storage unit 114 can be implemented with hardware circuitry including a volatile memory, a nonvolatile memory, an internal memory, an external memory, or a combination thereof. For example, the host storage unit 114 can be a nonvolatile storage such as non-volatile random access memory (NVRAM), an electronic solid state nonvolatile storage, such as Flash memory, disk storage, resistive random-access memory (ReRAM), Phase-change memory (PRAM), or a volatile storage such as static random access memory (SRAM). As a specific example, the host storage unit 114 can include random access memory (RAM), synchronous dynamic access memory (SDRAM,) in the form of hardware modules, such as dual in-line memory modules (DIMM).

The host storage unit 114 can include a host storage interface 124. The host storage interface 124 can be used for communication between other units in the host device 102. The host storage interface 124 can also be used for communication that is external to the host device 102. Further, for illustrative purposes, the host storage unit 114 has been depicted with the components including the host storage interface 124 and the host software 126, although it is understood that the host storage unit 114 can include additional components. For example, the host storage unit 114 can include some or all of the components that are included in the memory device 104, such as the device control unit 152, the flash translation layer 158, the capacity manager 160, the memory garbage collector 162, the memory interface 164, the memory storage unit 154, the memory blocks 168, the memory pages 170, or a combination thereof. Each of these elements will be discussed in detail below.

The host storage interface 124 can receive information from the other units or from external sources, or can transmit information to the other units or to external destinations. The external sources and the external destinations refer to sources and destinations external to the host device 102.

The host storage interface 124 can include different implementations depending on which units or external units are being interfaced with the host storage unit 114. The storage interface 124 can be implemented with technologies and techniques similar to the implementation of the host control interface 122.

The host communication unit 116 can enable external communication to and from the host device 102. For example, the host communication unit 116 can permit the host device 102 to communicate with the memory device 104 or other attachments, such as a peripheral device or a computer desktop. The host communication unit 116 can include active and passive components, such as microelectronics, filters, modulators, demodulators, detectors, decoders, a base band modem, or an antenna.

The host communication unit 116 can include a host communication interface 128. The host communication interface 128 can be used for communication between the host communication unit 116 and other units in the host device 102. The host communication interface 128 can receive information from the other units or can transmit information to the other units.

The host communication interface 128 can include different implementations depending on which units are being interfaced with the host communication unit 116. The host communication interface 128 can be implemented with technologies and techniques similar to the implementation of the host control interface 122.

The host user interface 118 allows a user (not shown) to interface and interact with the host device 102. The host user interface 118 can include an input device and an output device. Examples of the input device of the host user interface 118 can include a keypad, a touchpad, soft-keys, a keyboard, a microphone, an infrared sensor for receiving remote signals, or any combination thereof to provide data and communication inputs. As a further example, the host user interface 118 can enable interfacing with the host device 102 through a remote or network connection.

The host user interface 118 can include a display interface 130. The display interface 130 can include connectivity for a display, a projector, a video screen, a speaker, or any combination thereof.

The host control unit 112 can operate the host user interface 118 to display information generated by the computing system 100. The host control unit 112 can also execute the host software 126 for the other functions of the computing system 100.

The units in the host device 102 can work individually and independently of the other units. The host device 102 can work individually and independently from the memory device 104.

The memory device 104 is standalone memory storage hardware based on non-volatile memory technology. For example the memory device 104 can be a solid state memory device configured to operate as part of a multi-level cache system. The memory device 104 can be configured to operate as a caching device in a multi-tier caching system. For example, the memory device 104 can implement capacity management and eviction operations independent of host device 102. The memory device can include a device control unit 152, a memory storage unit 154, and a memory device interface 156.

The device control unit 152 can be implemented in a number of different manners of hardware circuitry. For example, the device control unit 152 can be a processor, such as a CPU, an application specific integrated circuit (ASIC) an embedded processor, a microprocessor, a hardware control logic, a hardware finite state machine (FSM), a digital signal processor (DSP), or a combination thereof. The device control unit 152 can include dedicated circuitry, such as a memory controller, memory chip controller, or memory controller unit, for memory allocation operations and flow of information.

The device control unit 152 can implement firmware for operation of the memory device 104. For example, the device control unit 152 can operate a flash translation layer 158. The flash translation layer 158 is a component for implementing mechanisms and processes for operation of the memory device 104, such as read, programming, and mapping operations. The flash translation layer 158 can include firmware components, such as a capacity manager 160, a memory garbage collector 162, and a memory input/output (I/O) interface 164.

The capacity manager 160 is a component that monitors the status and activity of key-value pairs 165 within the memory device 104. For example, the capacity manager 160 can processes the values of incoming instances of key-value pairs 165 for storage in the memory storage unit 154. In another example, the capacity manager 160 can identify candidates for erase operations. Each of these operations will be discussed below.

The memory garbage collector 162 is component for handling erase operations within the memory storage unit 154. For example, memory garbage collector 162 can identify and erase memory blocks based on information received from the capacity manager 160.

The memory I/O interface 164 is a component for handling requests to access the memory storage unit 154. For example, the memory I/O interface 164 can process read, programming, or erase operations for the memory storage unit 154. As a specific example, the memory I/O interface 164 can access the memory storage unit 154 to program the memory pages 170 with a value (VAL) of the key-value pairs 165 received by the capacity manager 160. In another specific example, the memory I/O interface 164 can access the memory storage unit 154 to retrieve the value of the key-value pairs 165 for a read operation. In a further specific example, the memory I/O interface 164 can access the memory blocks 168 within the memory storage unit 154 to execute an erase operation. The capacity manager 160, the memory garbage collector 162, and the memory I/O interface 164 operate independently or can communicate with one another for operation of the memory device 104.

The memory storage unit 154 is a non-transitory computer readable medium. For example, memory storage unit 154 can be a non-volatile memory such as flash memory, including NAND flash memory, ferroelectric random access memory (FRAM), or magnetoresistive random-access memory (MRAM), and the like. The memory storage unit 154 can include memory components and sub-components, such as planes (not shown), memory blocks 168, and memory pages 170. As an example, the memory pages 170 can be the smallest segment in the memory storage unit 154 that can undergo a programming operation. The memory blocks 168 can include a number of the memory pages 170. The memory blocks 168 can be the smallest segment in the memory storage unit 154 that can undergo an erase operation.

The memory device interface 156 is for providing connection to devices external to the memory device 104. For example, the memory device interface 156 can provide the hardware for direct or indirect connection to the host device 102. As a specific example, the memory device interface 156 can provide direct attachment for the memory device 104 to the host device 102 through a peripheral component interconnect or peripheral component interconnect express (PCIe) connection. In another specific example, the memory device interface 156 can provide connection between the memory device 104 and the host device 102 on a network, such as a local area network (LAN), metropolitan area network (MAN), or wide-area network (WAN) through wired or wireless communication. Examples of wired communication can include communication through digital subscriber line (DSL), fiber optic connection, or an Ethernet connection with interfaces for a category (Cat) 5, Cat 5e, or Cat 6 connection. Satellite communication, cellular communication, Bluetooth, Infrared Data Association standard (IrDA), and wireless fidelity (WiFi) are examples of wireless communication.

Figure 2:
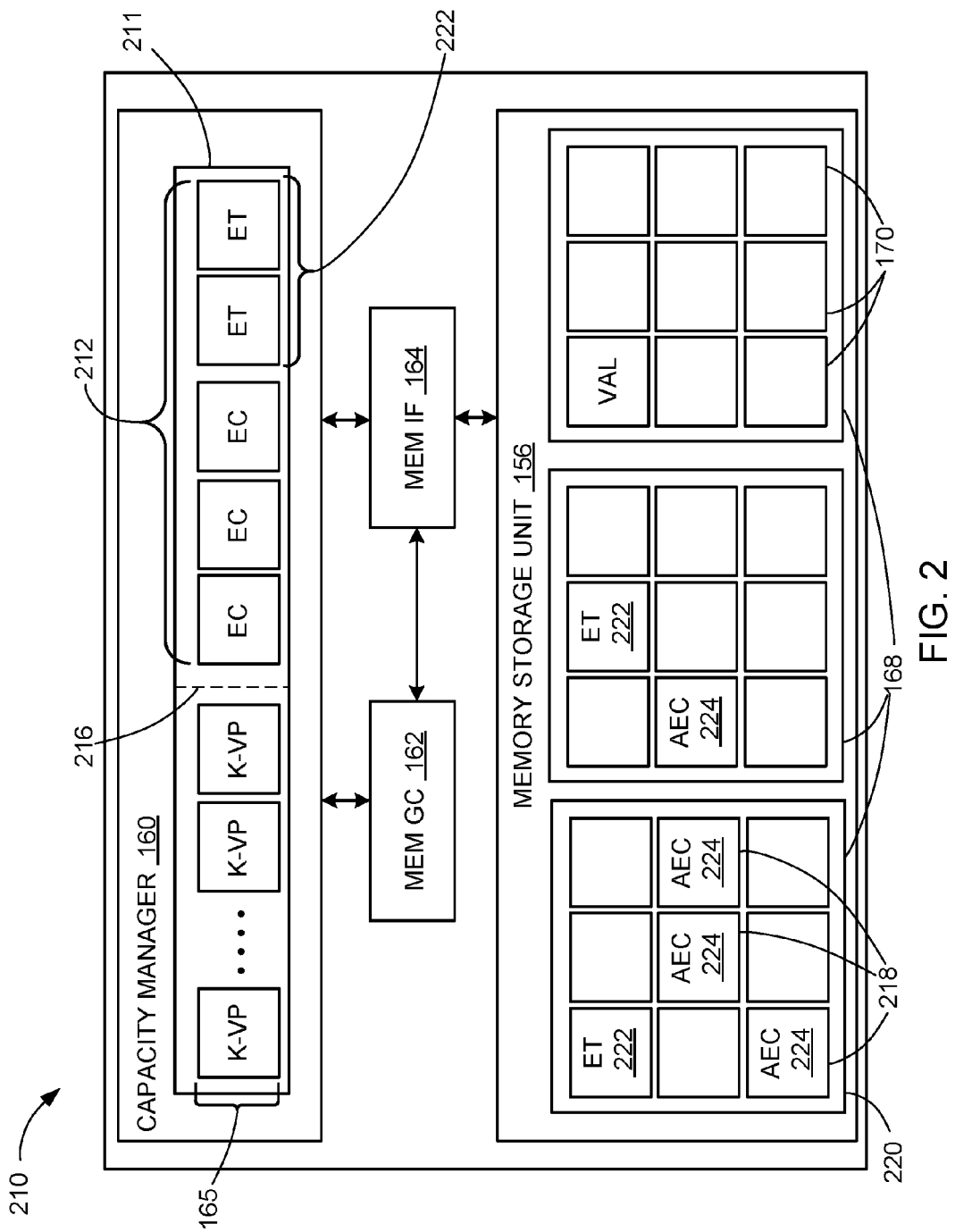
FIG. 2 is an example of a cache eviction process for the computing system in a first embodiment of the present invention.

Referring now to FIG. 2, therein is shown an example of a cache eviction process 210 for the computing system 100 in a first embodiment of the present invention. The cache eviction process 210 is an object selection and eviction operation. The cache eviction process 210 enables the memory device 104 to operate as a standalone caching device. The cache eviction process 210 can be executed by the device control unit 152 on the memory device 104 of FIG. 1 and implemented with the capacity manager 160, memory garbage collector 162, the memory I/O interface 164, or a combination thereof, as described below.

The cache eviction process 210 can be illustrated with a key-value registry 211 of the capacity manager 160. The key-value registry 211 is a dictionary of information associated with the key-value pairs 165 of the memory device 104. Additional details of the key-value registry 211 will be discussed below. The key-value registry 211 can track key-value eviction candidates 212 and eviction targets 222.

The key-value eviction candidates 212 are key-value pairs 165 that meet an eviction criteria. For example, the key-value eviction candidates 212 can be instances of the key-value pairs 165 having eviction criteria that exceed an eviction threshold 216. The eviction criteria and the eviction threshold 216 can be based on eviction policies according to factors such as frequency of access, time in storage, and most recent activity, amongst others, which will be discussed further below. In the cache eviction process 210, the capacity manager 160 can identify the key-value eviction candidates 212 from the key-value pairs 165 of the key-value registry 211. As a specific example, the capacity manager 160 can identify the key-value eviction candidates 212 as the instances of the key-value pairs 165 exceeding the eviction threshold 216 (however that may be measured), which is illustrated as the dashed line of FIG. 2.

The eviction targets 222 are instances of the key-value eviction candidates 212 selected for eviction according to the policies for eviction. As an example, for a policy based on frequency of access, the eviction targets 222 can be selected as the instances of the key-value eviction candidates 212 with the lowest frequencies of access. In another the example, for a policy based on most recent access, the eviction targets 222 can be selected as the instances of the key-value eviction candidates 212 with the longest period since last access. In a further example, for the policy based on time in storage, the eviction targets 222 can be selected as the instances of the key-value eviction candidates 212 with the longest periods of time stored in the memory storage unit 156. The selection of the eviction targets 222 from the key-value eviction candidates 212 will be discussed in detail below.

In the cache eviction process 210, the memory garbage collector 162 can select an erase block 220, which is an instance of the memory blocks 168 within the memory storage unit 154 that includes one of the eviction targets 222. For example, the memory garbage collector 162 can calculate an associated eviction count 218 of associated eviction candidates 224 for the eviction targets 222. The associated eviction candidates 224 are the key-value eviction candidates 212 that are within the same instance of the memory blocks 168 as one of the eviction targets 222. To further the example, the memory garbage collector 162 can select the erase block 220 as the memory blocks 168 with the eviction targets 222 having the highest value of the associated eviction count 218.

For illustrative purposes, FIG. 2 is shown with two of the eviction targets 222, although it is understood that a different number of eviction targets 222 can be identified in the cache eviction process 210. The details of the cache eviction process 210, including the determination of the key-value eviction candidates 212, the selection of the erase block 220 and associated steps, will be discussed in detail below.

Figure 3:
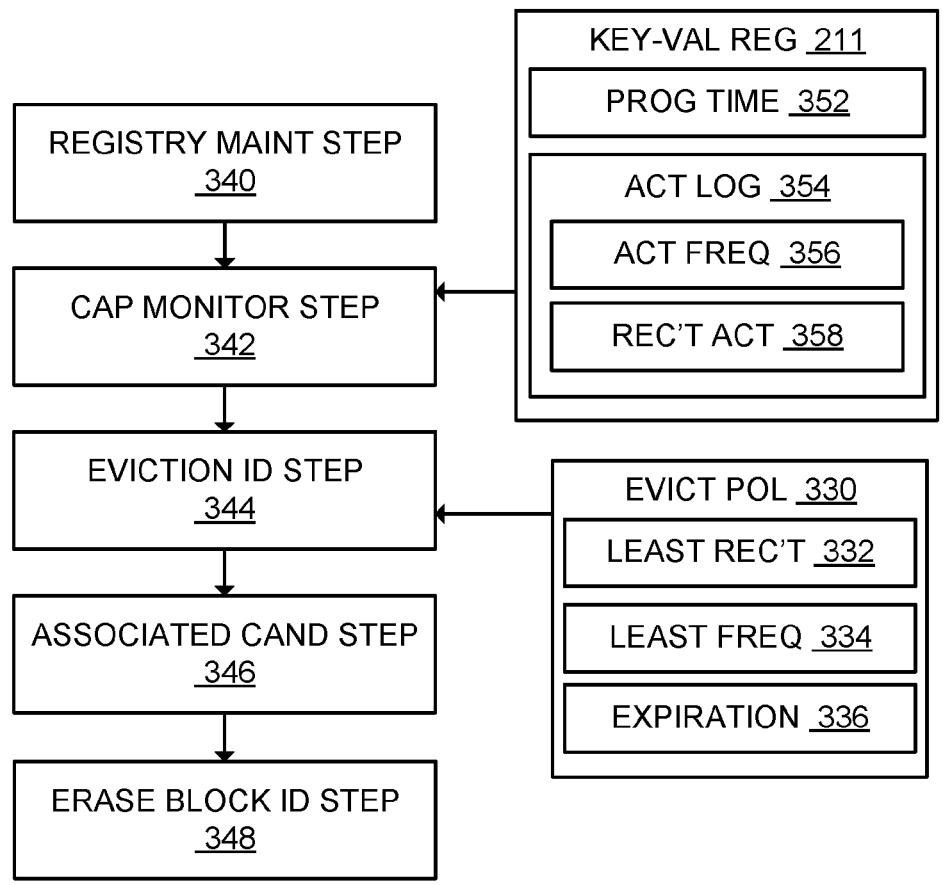
FIG. 3 is an exemplary flow chart for the cache eviction process of FIG. 2 of computing system.

Referring now to FIG. 3, therein is shown a flow chart for the cache eviction process of FIG. 2 of the computing system 100. The memory management mechanism of the computing system 100 can be implemented in a number of different ways. One example of the implementation is described in the flow chart described herein, which depicts the cache eviction process 210 of FIG. 2 for the memory device 104 of FIG. 1. In general, the cache eviction process 210 can be implemented autonomously based on an eviction policy 330. More specifically, the cache eviction process 210 can be initiated by the device control unit 152 through the capacity manager 160 of FIG. 2 absent external commands, such as those from the host device 102 of FIG. 1.

The eviction policy 330 is a rule for determining candidates for eviction of data from a memory unit. For example, the eviction policy 330 can identify the key-value pairs 165 of FIG. 1 as the key-value eviction candidates 212 of FIG. 2 based on the frequency the key-value pairs 165 are accessed, how recently the key-value pairs 165 has been accessed, the total time the value of the key-value pairs 165 have been stored in the memory storage unit 154, or a combination thereof. The eviction policy 330 can include a least recent policy 332, a least frequent policy 334, an expiration policy 336, or a combination thereof.

The least recent policy 332 is an eviction policy based on how recently an instance of the key-value pairs 165 has been accessed. For example, the least recent policy 332 can target the key-value pairs 165 as the key-value eviction candidates 212 with the longest duration of time since last access among the values of the key-value pairs 165 in the memory storage unit 154.

The least frequent policy 334 is an eviction policy based on how frequently an instance of the key-value pairs 165 is accessed. For example, the least frequent policy 334 can target the key-value pairs 165 as the key-value eviction candidates 212 that are least frequent access among values of the key-value pairs 165 in the memory storage unit 154.

The expiration policy 336 is a policy based on time in the memory storage unit 154. For example, the expiration policy 336 can target the key-value pairs 165 having values that have been stored in the memory storage unit 154 for the greatest period of time relative to the other instances of the key-value pairs 165.

The flow for the cache eviction process 210 can include a registry maintenance step 340, a capacity monitoring step 342, an eviction identification step 344, an associated candidate step 346, and an erase block identification step 348. The flow for the cache eviction process 210 of the computing system 100 can begin with the registry maintenance step 340. The registry maintenance step 340 is for maintaining and updating a registry of key-value stores in the storage device.

In the registry maintenance step 340, the capacity manager 160 can maintain the key-value registry 211. The key-value registry 211 can include registry information associated with each of the key-value pairs 165. For example, the key-value registry 211 can include information about the key and location of the value of the key-value pair 165 stored in the memory storage unit 154 of FIG. 1. In another example, the key-value registry 211 can include a program timestamp 352, an activity log 354, or a combination thereof for each of the key-value pairs 165.

The program timestamp 352 is the point in time that the value of an instance of the key-value pairs 165 was programmed into the memory storage unit 154. The activity log 354 is a record of access to the value of the key-value pairs 165.

The activity log 354 can track an activity frequency 356 and a recent activity 358 associated with the key-value pairs 165. The activity frequency 356 is a measure of the frequency that the key-value pairs 165 is accessed. The recent activity 358 is a record for the last time the value of key-value pairs 165 was accessed.

The capacity manager 160 can maintain the key-value registry 211 by monitoring the key-value pairs 165. For example, the capacity manager 160 can update the key-value registry 211 in association with a programming or erase operation, such as when the value of a new instances of the key-value pairs 214 are received by the memory device 104 or when the key-value pairs 165 are erased from memory device 104. As a specific example the capacity manager 160 can update the key-value registry 211, including the activity log 354, by adding the program timestamp 352 to the new instances of the key-value pairs 165 received from the host device 102 for storage in the memory storage unit 154. In another specific example, the capacity manager 160 can also maintain the key-value registry 211 by removing key-value pairs 165 from the key-value registry 211 following an erase operation. The device control unit 152 can utilize the capacity manager 160 to execute the registry maintenance step 340 as described above.

The flow can continue to the capacity monitoring step 342. The capacity monitoring step 342 is for monitoring the registry of the key-value pairs 165 to identify candidates for eviction. The capacity monitoring step 342 can identify the key-value eviction candidates 212 according to the eviction policy 330. More specifically, the capacity monitoring step 342 can determine the eviction threshold 216 of FIG. 2 based on the eviction policy 330.

For the least frequent policy 334, the eviction threshold 216 can correspond to the activity frequency 356 of the key-value pairs 165. For example, the key-value pairs 165 having the activity frequency below the eviction threshold 216 can be identified as the key-value eviction candidates 212.

For the least recent policy 332, the eviction threshold 216 can correspond to the recent activity 358 of the key-value pairs 165. For example, the key-value pairs 165 having the recent activity 358 below the eviction threshold 216 can be identified as the key-value eviction candidates 212.

For the expiration policy 336, the eviction threshold 216 can correspond to the program timestamp 352. For example, the key-value pairs 165 having the program timestamp 352 that exceeds the eviction threshold 216 can be identified as the key-value eviction candidates 212. The device control unit 152 can utilize the capacity manager 160 to execute the capacity monitoring step 342 as described above.

The flow can continue to the eviction identification step 344. The eviction identification step 344 is for identifying the eviction targets 222 of FIG. 2. For example, in the eviction identification step 344, the memory garbage collector 162 can select the eviction targets 222 from the key-value eviction candidates 212 based on the eviction policy 330.

In the example of the least frequent policy 334, the memory garbage collector 162 can identify one or more of the key-value eviction candidates 212 with the least amount of activity among the key-value pairs 165 in the key-value registry 211 as the eviction targets 222. In the example of the least recent policy 332, the memory garbage collector 162 can identify one or more of the key-value eviction candidates 212 that has had the longest periods of inactivity among the key-value pairs 165 in the key-value registry 211 as the eviction targets 222. In the example of the expiration policy 336, the memory garbage collector 162 can identify one or more of the key-value eviction candidates 212 that have been in the memory device 104 for the longest period of time, relative to the other instances of the key-value pairs 165 in the key-value registry 211, as the eviction targets 222.

The device control unit 152 can utilize the memory garbage collector 162 to execute the eviction identification step 344 as described above.

The flow can continue to the associated candidate step 346. The associated candidate step 346 is for identifying the associated eviction candidates 224 and determining the associated eviction count 218 of FIG. 2 for the eviction targets 222. In the associated candidate step 346, the capacity manager 160 can identify the associated eviction candidates 224 as the key-value eviction candidates 212 that are in the same instance of the memory blocks 168 as the eviction targets 222. For each instance of the eviction targets 222, the capacity manager 160 can calculate the associated eviction count 218 as the total number of the associated eviction candidates 224 of the particular instance of the eviction targets 222. The device control unit 152 can utilize the capacity manager 160 to execute the associate candidate step 346 as described above.

The flow can continue to the erase block identification step 348. The erase block identification step 348 is for identification of the optimum block of memory for an erase operation. In the erase block identification step 348, the memory garbage collector 162 can select the erase block 220 from the memory blocks 168 in the memory storage unit 154 based on the associated eviction count 218. For example, the memory garbage collector 162 can select the erase block 220 as the memory blocks 168 associated with the highest value of the associated eviction count 218. The device control unit 152 can utilize the memory garbage collector 162 to execute the erase block identification step 348 as described above. Further, the memory garbage collector 162 can communicate with the memory I/O interface 164 to issue an erase command for or perform an erase operation on the erase block 220.

It has been discovered that the eviction policy for self-eviction of the key-value pairs 165 enables a non-volatile memory device, such as the memory device 104, to better function as a caching device.

Figure 4:
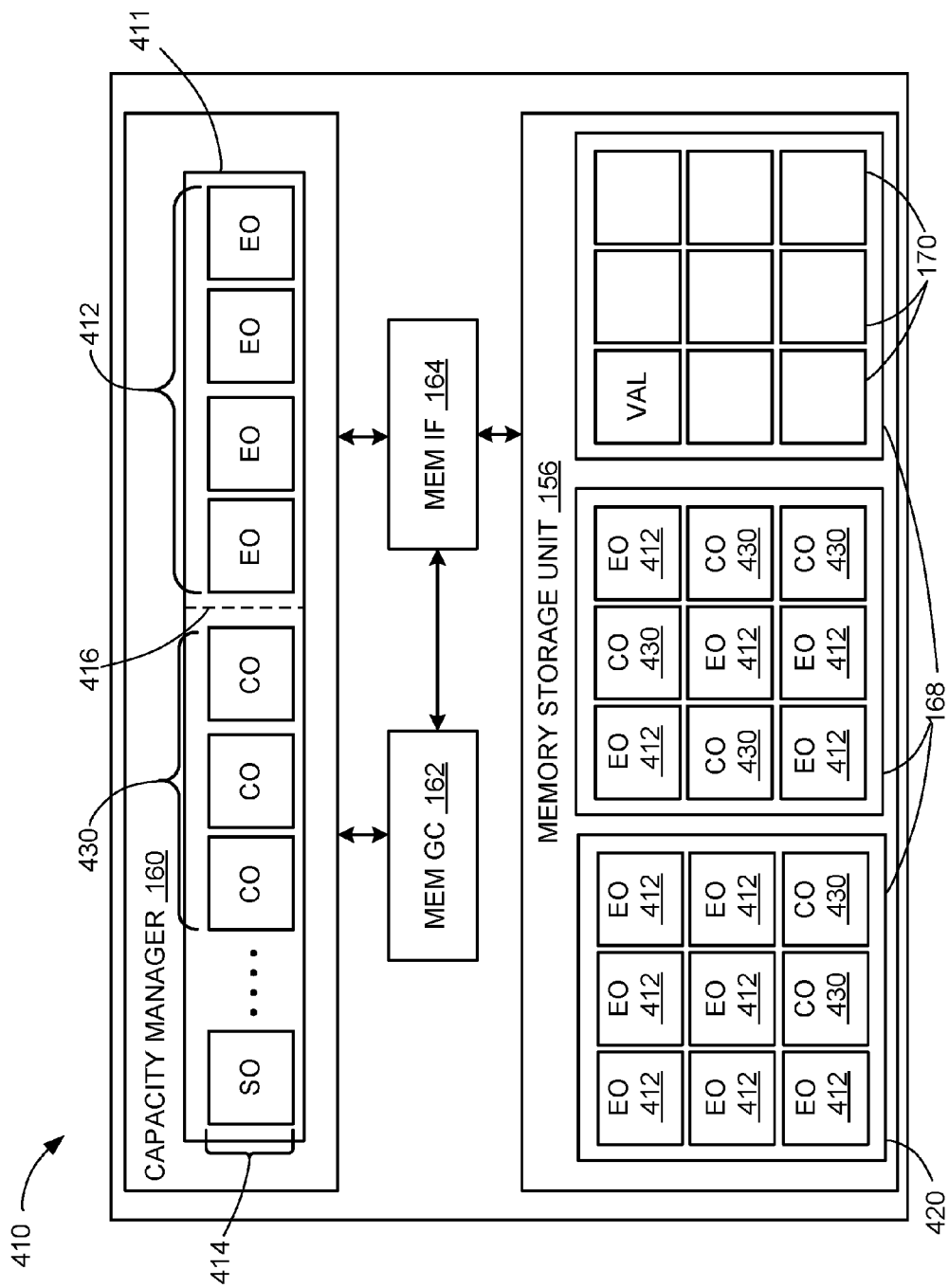
FIG. 4 is a schematic example of a cache management process for the computing system in a second embodiment of the present invention.

Referring now to FIG. 4, therein is shown an example of a cache management process 410 for the computing system 100 in a second embodiment of the present invention. The cache management process 410 is an object selection and management operation. The cache management process 410 enables the memory device 104 or the host storage unit 114 to operate as a standalone caching device. In general, the cache management process 410 can select objects for storage in a cache of the memory device 104, the host storage unit 114, or a combination thereof or eviction from the memory device 104, the host storage unit 114, or a combination thereof. More specifically, the cache management process 410 can maintain the memory blocks 168 of FIG. 1 and selection of the erase blocks 420 of FIG. 4 based on the state of storable objects 414. The storable objects 414 are objects that can be stored on the memory device 104, the storage unit 114, or a combination thereof. As an example, the storable objects 414 can be the key-value pairs 165 of FIG. 1.

In one implementation, the cache management process 410 can be executed by the device control unit 152 on the memory device 104 of FIG. 1 and implemented with the capacity manager 160, the memory garbage collector 162, the memory I/O interface 164, or a combination thereof, as described below. In another implementation, the cache management process 410 can be executed with the storage unit 114 of FIG. 1 independent of interaction or instructions from the host control unit 112. For simplicity of discussion, the cache management process 410 is described with respects to the memory device 104, although it is understood that the functions and operations described below can also be implemented with the host storage unit 114.

The cache management process 410 can be illustrated with an object registry 411 of the capacity manager 160. The object registry 411 is a dictionary of information associated with the storable objects 414. Additional details of the object registry 411 will be discussed below. The object registry 411 can track evictable objects 412 and cacheable objects 430. The evictable objects 412 are instances of the storable objects 414 that meet eviction criteria. The cacheable objects 430 are instances of the storable objects 414 that are qualified for caching in the memory storage unit 154.

In the cache management process 410, the capacity manager 160 can identify the evictable objects 412 and the cacheable objects 430 from the storable objects 414 of the object registry 411 based on an eviction threshold 416. The eviction threshold 416, which is illustrated as the dashed line of FIG. 4, can be based on eviction policies according to factors such as frequency of access, time in storage, most recent activity, and the size of the storable objects 414 or amount of space the storable objects 414 occupy, amongst others, which will be discussed further below.

In general, the evictable objects 412 can be identified as the storable objects 414 having the eviction criteria that exceed the eviction threshold 416, where exceeding the eviction threshold 416 can be above or below the eviction threshold 416 based on the specific instance of the eviction criteria. The cacheable candidates 430 can be identified as valid instances of the storable objects 414 for storage in a device cache based on the eviction threshold 416. Additional details for identifying the evictable objects 412 and the cacheable objects 430 will be discussed in detail below.

In the cache management process 410, the device control unit 152 of FIG. 1 can manage the workload of the memory garbage collector 162 and performance of the memory device 104 by dynamic selection of an erase block 420, which is an instance of the memory blocks 168 within the memory storage unit 154 that includes one or more of the evictable objects 412. For example, the memory garbage collector 162 of the device control unit 152 can select the erase block 420 based on Quality of Service (QoS) requirements.

In another example, the device control unit 152 can select and relocate the cacheable objects 430. As a specific example, the cacheable objects 430 in the erase block 420 can be relocated to another instance of the memory blocks 168 prior to performing the erase operation on the erase block 420. The details of the cache management process 410, including the identification of the evictable objects 412, identification of the cacheable objects 430, the selection of the erase block 420, and associated steps, will be discussed in detail below.

Figure 5:
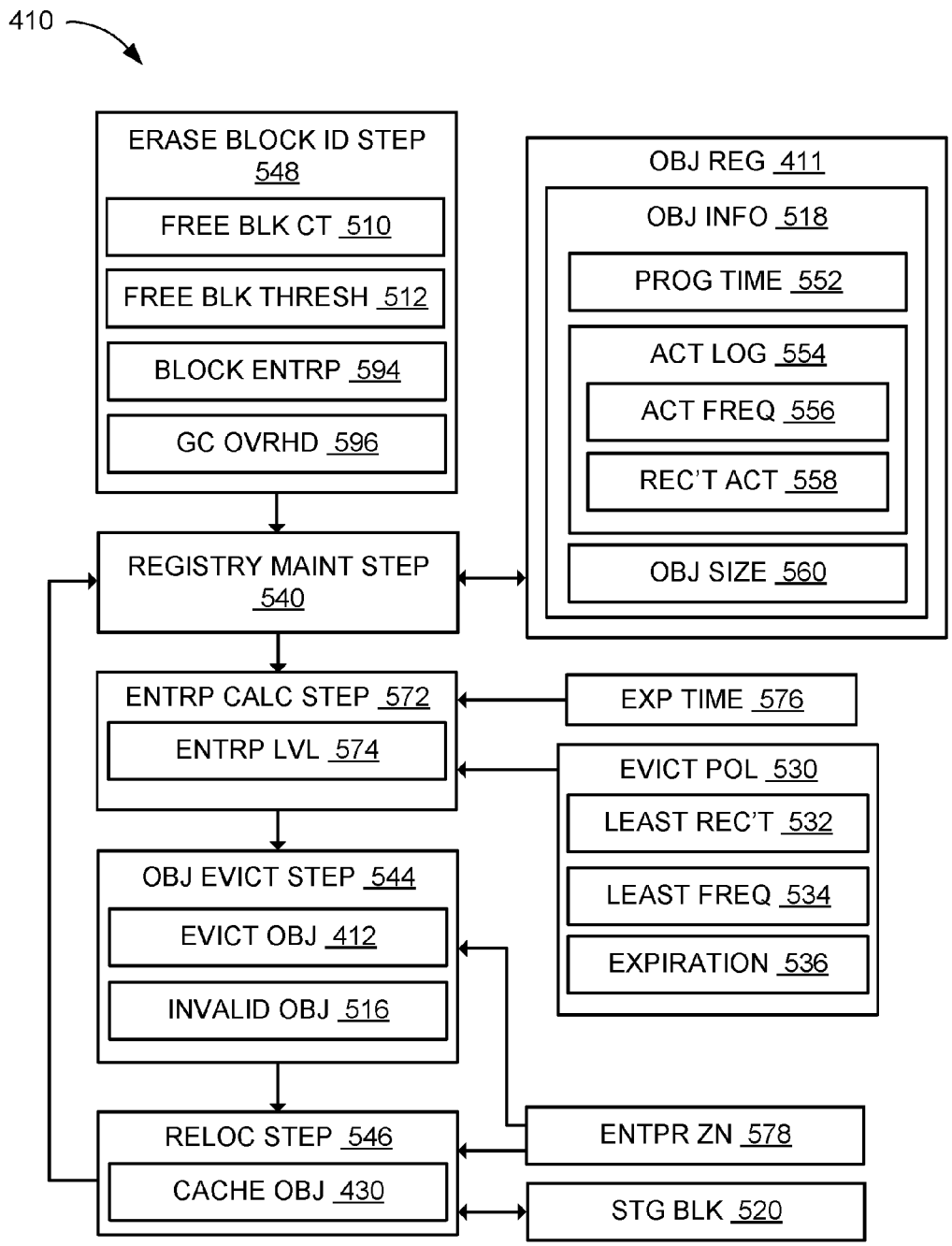
FIG. 5 is an exemplary flow chart for the cache management process of FIG. 4 of computing system.

Referring now to FIG. 5, therein is shown a control flow for the cache management process 410 of FIG. 4 of the computing system 100. In the control flow described below, implementation of memory management mechanism of the computing system 100 depicts the cache management process 410 for the memory device 104 of FIG. 1, the host storage unit 114 of FIG. 1, or a combination thereof. In general, the cache management process 410 can be implemented autonomously to select the erase block 420 of FIG. 4 from the memory blocks 168 of FIG. 1 based on the state of the storable objects 414 which are determined according to one or more eviction policies 530. In one implementation, the cache management process 410 can be initiated by the device control unit 152 through the capacity manager 160 of FIG. 1 absent external commands, such as those from the host device 102 of FIG. 1. In another implementation, the cache management process 410 can be initiated by the host storage unit 114 absent commands from the host control unit 112 of FIG. 1. For the sake of simplicity, the control flow is discussed with respects to the memory device 104 and associated components, although it is understood that the cache management process 410 can be similarly implemented by the host storage unit 114. Further, it is understood that the host storage unit 114 can include components similar to those of the memory device 104, such as the device control unit 152, the flash translation layer 158, the capacity manager 160, the memory garbage collector 162, the memory storage unit 154, the memory block 168, all of FIG. 1, or a combination thereof.

The eviction policies 530 are rules for determining candidates for eviction from a memory unit. For example, the eviction policies 530 can be implemented to identify the evictable objects 412 of FIG. 4 from the storable objects 414 of FIG. 4 based on the frequency the storable objects 414 are accessed, how recently the storable objects 414 have been accessed, the total time the storable objects 414 have been stored in the memory storage unit 154, the size or amount of space occupied by the storable objects 414, or a combination thereof. The eviction policies 530 can include a least recent policy 532, a least frequent policy 534, an expiration policy 536, or a combination thereof.

The least recent policy 532 is an instance of the eviction policies 530 based on how recently an instance of the storable objects 414 has been accessed. For example, the least recent policy 532 can identify the evictable objects 412 as the storable objects 414 with the longest duration of time since last access among the values of the storable objects 414 in the memory storage unit 154.

The least frequent policy 534 is an instance of the eviction policies 530 based on how frequently an instance of the storable objects 414 is accessed. For example, the least frequent policy 534 can identify the evictable objects 412 as the storable objects 414 that are least frequently accessed among values of the storable objects 414 in the memory storage unit 154.

The expiration policy 536 is an instance of the eviction policies 530 based on time in the memory storage unit 154. For example, the expiration policy 536 can identify the evictable objects 412 as the storable objects 414 having values that have been stored in the memory storage unit 154 for the greatest period of time relative to the other instances of the storable objects 414.

The control flow for the cache management process 410 can include an erase block identification step 548, a registry maintenance step 540, an entropy calculation step 572, an eviction identification step 544, and a relocation step 546. The control flow for the cache management process 410 of the computing system 100 can begin with the erase block identification step 548, however it is understood that the order of the steps in the control flow are presented as an example and can be performed in various orders. For example, the control flow can begin with the registry maintenance step 540.

The erase block identification step 548 is for implementing a garbage collection process by identification of one or more blocks of memory that qualify for an erase operation. In the erase block identification step 548, the memory garbage collector 162 can dynamically identify the erase block 420 from the memory blocks 168 in the memory storage unit 154.

The erase block identification step 548 can initiate the garbage collection process based on a free block counter 510 and a free block threshold 512. The free block counter 510 is the number of the memory blocks 168 that are free or available for storing objects at the time the garbage collection process is initiated. The free block threshold 512 is the number of the memory blocks 168 to be maintained as the free instances of the memory blocks 168. For example, the free block threshold 512 can be determined based on the QoS requirements.

During initiation of the garbage collection process, the device control unit 152 can compare the free block counter 510 to the free block threshold 512. For example, if the free block counter 510 indicates that the number of memory blocks 168 that are free or available for storage exceeds the free block threshold 512, then the garbage collection process can be cancelled. To continue the example, if the free block counter 510 indicates that the number of memory blocks 168 that are free or available for storage is below the free block threshold 512, meaning that an insufficient number of the memory blocks 168 are free or available according to the QoS requirements, then the memory garbage collector 162 can proceed with the garbage collection process to generate additional free instances of the memory blocks 168 to meet the QoS requirements.

In the erase block identification step 548, the memory garbage collector 162 can dynamically identify the erase block 420 based on various factors. In general, the device control unit 152 can select the erase block 420 as the memory blocks 168 having the lowest value of a block entropy 594, however, other factors can be considered, which will be discussed below.

The block entropy 594 is a collective measure of an entropy level 574 for the storable objects 414 associated with each instance of the memory block 168. The entropy level 574 is a metric for ranking the storable objects 414 based on one or more of the eviction policies 530. For example, the entropy level 574 can be a metric used to rank the evictability of the storable objects 414 according to a single instance of the eviction policies 530 or a combination of multiple instances of the eviction policies 530. Calculation of the entropy level 574 of the storable objects 414 will be discussed in detail below.

The block entropy 594 can, for example, be calculated as the median value of the entropy level 574 for each of the storable objects 414 associated with a particular instance of the memory block 168. In another example, the block entropy 594 can be calculated as the average of the entropy level 574 for each of the storable objects 414 associated with a particular instance of the memory blocks 168. Each of the memory blocks 168 can have a different instance of the block entropy 594 that corresponds to one instance of the eviction policies 530 or a combination of multiple instances of the eviction policies 530.

In an implementation, the memory garbage collector 162 can select the erase block 420 as the memory blocks 168 associated with the lowest value of the block entropy 594 within the memory storage unit 156. In the event that more than one instance of the memory blocks 168 has the lowest value of the block entropy 594, the memory garbage collector 162 can select the erase block 440 having the fewest number of associated instances of the storable objects 414, or more specifically, as the fewest number of the storable objects 414 stored therein.

Other factors can also be considered for identification of the erase block 420. For example, the device control unit 152 can identify the erase block 420 as one of the memory blocks 168 having the highest number of the evictable objects 412, invalid objects 516 or a combination thereof. The invalid objects 516 are instances of the storable objects 414 that have been deleted or overwritten.

As another factor, the device control unit 152 can identify the erase block 420 as one of the memory blocks 168 having the highest amount of reclaimable space. For example, the reclaimable space can be the total amount of bytes in an instance of the memory blocks 168 that is occupied by the invalid objects 516, the evictable objects 412, or a combination thereof.

In the erase block identification step 546, the workload of the memory garbage collector 162 can be based on a garbage collection overhead 596. The garbage collection overhead 596 can be determined by a number of factors. For example, the garbage collection overhead 596 can be determined based on the number of valid instances of the storable objects 414, such as the cacheable objects 430, per instance of the memory block 168, the total amount of space occupied by valid instances of the storable objects 414 per instance of the memory block 168, the number of erase operation to be undertaken by the memory garbage collector 162, or a combination thereof.

The garbage collection overhead 596 can be dynamically adjusted based on a number of factors to meet the Quality of Service (QoS) requirements for the host device 102 of FIG. 1. For example, the garbage collection overhead 596 can be adjusted based on the number of instances of the erase block 420 identified to undergo an erase operation, the total number of the evictable objects 412, the size of the evictable objects 412, such as the number of bytes occupied by the evictable objects 412, or a combination thereof.

The number of instances of the erase block 420 that are selected for the erase operation can be determined by the QoS requirements. For example, if too many instances of the storable objects 414, as determined by the QoS requirements, exist in the memory device 104, lookup overhead can exceed what is allowed by the QoS requirements. In this situation, the memory garbage collector 162 can give more preference to reducing the number of the storable objects 414 rather than the eviction based on the object size 560 of the evictable objects 412, which can reduce the total number of the storable objects 414 in the memory device 104.

In the event that too few instances of the memory block 168 are identified as the erase block 420 to meet the QoS requirements, the memory garbage collector 162 can apply multiple instances or a combination of the eviction policies 530 at the same time or adjust the eviction threshold 416. For example, if too few of the evictable objects 412 are identified under the expiration policy 536, the memory garbage collector 164 can apply the least recent policy 532, the least frequent policy 534, or a combination thereof to identify further instances of the evictable objects 412 within one instance of the memory block 168, or across a number of instances of the memory block 168 to meet the QoS requirements. In another example, the memory garbage collector 162 can increase the eviction threshold 416 to expand the number of the evictable objects 412.

The device control unit 152 can utilize the memory garbage collector 162 to execute the erase block identification step 548 as described above. Further, the memory garbage collector 162 can communicate with the memory I/O interface 164 to issue an erase command for or perform an erase operation on the erase block 420.

The block entropy 594 can be calculated based on information in the object registry 411, which is maintained in the registry maintenance step 540. The registry maintenance step 540 is for maintaining and updating a registry of objects stored in the storage device. In the registry maintenance step 540, the capacity manager 160 can maintain the object registry 411. The object registry 411 can include object information 518 associated with each of the storable objects 414. The object information 518 is information related to storage and access of the storable objects 414. For example, in the case of the storable objects 414 including the key-value pairs 165 of FIG. 1, the object information 518 can include information about the key and location of the value of the key-value pair 165 stored in the memory storage unit 154 of FIG. 1. In another example, the object registry 411 can include a program timestamp 552, an activity log 554, or a combination thereof for each of the storable objects 414. In a further example, the object registry 411 can include information an object size 560 of the storable objects 414, such as the number of bytes occupied by the value of the storable objects 414 that include the key-value pair 165 stored in the memory block 168. In yet a further example, the object registry 411 can include the entropy level 574 for each of the storable objects 414.

The program timestamp 552 is the point in time that the storable objects 414 was programmed into the memory storage unit 154. The activity log 554 is a record of access to the storable objects 414

The activity log 554 can track an activity frequency 556 and a recent activity 558 associated with the storable objects 414. The activity frequency 556 is a measure of the frequency that the storable objects 414 are accessed. For example, the activity frequency 556 can be a count of the number of times a particular instance of the storable objects 414 is accessed over a period of time. The activity frequency 556 can be determined explicitly through direct operations, such as read and write operations, implicitly through indirect access frequency of the storable objects 414, or a combination thereof. An example of indirect access frequency measurement can occur when the storable objects 414 are involved in a sort function, such as with the swapping that occurs during a bubble sort, where the activity frequency 556 for an instance of the storable objects 414 being sorted can be relatively high when the particular instance of the storable objects 414 are being moved.

The recent activity 558 is a record for the last time the storable objects 414 were accessed. The recent activity 558 can be explicitly determined by the most recent instance of the program timestamp 552, implicitly determined based on indirect access, such as movement of the storable objects 414 in a search or sort list, or a combination thereof.

The capacity manager 160 can maintain the object registry 411 by monitoring the storable objects 414. For example, the capacity manager 160 can update the object registry 411 in association with a programming or erase operation, such as when the value of a new instances of the storable objects 414 are received by the memory device 104 or when the storable objects 414 are overwritten or erased from memory device 104. As a specific example, the capacity manager 160 can update the object registry 411, including the activity log 554, by adding the program timestamp 552 to the new instances of the storable objects 414 received from the host device 102 for storage in the memory storage unit 154. In another specific example, the capacity manager 160 can also maintain the object registry 411 by removing instances of the storable objects 414 from the object registry 411 following an erase operation. The device control unit 152 can utilize the capacity manager 160 to execute the registry maintenance step 540 as described above.

The object registry 411 can include the entropy level 574 for each of the storable objects 414 in the object registry 411. The entropy level 574 is a metric for ranking the storable objects 414 based on one or more of the eviction policies 530. For example, the entropy level 574 can be a metric used to rank the evictability of the storable objects 414 according to a single instance of the eviction policies 530 or a combination of multiple instances of the eviction policies 530. In general, a high relative value of the entropy level 574 corresponds to a low level of evictability in relation to other instances of the storable objects 414 while a low relative value of the entropy level 574 corresponds to a high level of evictability in relation to other instances of the storable objects 414.

The cache management process 410 can calculate the entropy level 574 for the storable objects 414 in the entropy calculation step 572. The entropy level 574 can be calculated based on different eviction criteria according to the eviction policies 530, such as the least frequency policy 534, the least recent policy 532, or the expiration policy 536.

For the least frequency policy 534, the entropy level 574 for each of the storable objects 414 can be calculated based on the activity frequency 556 of the associated instance of the storable objects 414. For example, the entropy level 574 for the least frequency policy 534 can be calculated as a weighted geometric mean of the activity frequency 556 and the object size 560 of an instance of the storable objects 414.

For the least recent policy 532, the entropy level 574 for each of the storable objects 414 can be calculated based on the recent activity 558 of an instance of the storable objects 414. For example, the entropy level 574 for the least recent policy 532 can be calculated as a weighted geometric mean of a recency normalized difference and the object size 560 of an instance of the storable objects 414. The recency normalized difference is the difference between the current time, or time at which the entropy level 574 is calculated, and the recent activity 558 divided by the object size 560 of the particular instance of the storable objects 414.

For the expiration policy 536, the entropy level 574 for each of the storable objects 414 can be calculated based on an expiration time 576 for the storable objects 414. For example, the entropy level 574 for the expiration policy 536 can be calculated as a weighted geometric mean of the expiration time 576 and the object size 560 of an instance of the storable objects 414. The expiration time 576 can be a limit or an expectation on the amount of time the storable objects 414 can be expected to remain in the memory storage unit 154, such a time to live (TTL) value.

Based on the calculated values of the entropy level 574 for each of the storable objects 414, the cache management process 410 can calculate the block entropy 594 for each of the memory blocks 168. As in the examples described above, the block entropy 594 can be calculated as the median value or the average value of the entropy level 574 for each of the storable objects 414 associated with a particular instance of the memory blocks 168. Calculation of the block entropy 594 can include the invalid objects 516, which have the corresponding instance of the entropy level 574 of "zero." Further, cache management process 410 can select the erase block 168 based on the process described in the erase block identification step 548 described above, including selection based on the block entropy 594.

Prior to performing the erase operation on the one or more instances of the erase block 168, the cache management process 410 can process each of the storable objects 414 in the erase block 168. For example, the cache management process 410 can identify the evictable objects 412 in the object evictability step 544 and the cacheable objects 430 in the relocation step 546.

In the object evictability step 544, the device control unit 152 can identify the evictable objects 412 based on the eviction threshold 416 of FIG. 4. In general, the evictable objects 412 can be identified as the storable objects 414 having the entropy level 574 that exceeds the eviction threshold 416, where exceeding the eviction threshold 416 can be above or below the eviction threshold 416 based on the specific instance of the eviction policies 530.

As an example, for the least frequent policy 534, the eviction threshold 416 can correspond to the activity frequency 556 of the storable objects 414. For instance, the storable objects 414 having the activity frequency below the eviction threshold 416 can be identified as the evictable object 412.

As another example, for the least recent policy 532, the eviction threshold 416 can correspond to the recent activity 558 of the storable objects 414. For instance, the storable objects 414 having the recent activity 558 below the eviction threshold 416 can be identified as the evictable object 412.

As a further example, for the expiration policy 536, the eviction threshold 416 can correspond to the program timestamp 552. For instance, the storable objects 414 having the program timestamp 552 that exceeds the eviction threshold 416 can be identified as the evictable object 412.

The cache management process 410 can include categorization of the storable objects 414 into entropy zones 578 based on one or more of the eviction policies 530. The entropy zones 578 are classifications or groupings of the storable objects 414 representing the evictability of the storable objects 414. In general, the lower values of the entropy zones 578 represent a higher evictability relative to other instance of the storable objects 414 while higher values of the entropy zones 578 represent a lower evictability relative to other instance of the storable objects 414. For example, the object registry 411 can be divided or partitioned into four zones, although any number of entropy zones 578 possible.

The storable objects 414 in the object registry 411 can be categorized into entropy zones 578 based on the entropy level 574 of the storable objects 414. Zone 0 can be the lowest range of the entropy level 574 representing the storable objects 414 that will be evicted or have the highest likelihood of eviction at the next garbage collection interval. In general, the invalid objects 516 and the evictable objects 412 fall into zone 0. Zone 1 can include the range of the entropy level 574 representing the storable objects 414 that are likely to be evicted at the next garbage collection interval. Zone 2 can include the range of the entropy level 574 representing the storable objects 414 that are unlikely to be evicted at the next garbage collection interval. Zone 3 can be the highest values of the entropy level 574 representing the storable objects 414 that almost certainly will not be evicted or have the lowest likelihood for eviction at the next garbage collection interval.

For illustrative purposes, the entropy zones 578 have been described having four different instances of the entropy zones 578, however, it is understood that the entropy zones 578 can be partitioned differently. For example, the entropy zones 578 can be partitioned into three or fewer instances of the entropy zones 578 or five or more instances of the entropy zones 578.

One or more of the memory blocks 168 can be associated with one of the entropy zones 578. For example, the memory blocks 168 can be allocated by the device control unit 152 to store the storable objects 414 corresponding to one of the entropy zones 578. More specifically, the memory blocks 168 allocated to a specific instance of the entropy zones 578 can store the storable objects 414 having the entropy level 574 of the same specific instance of the entropy zones 578.

The entropy zones 578 can be determined differently for each instance of the eviction policies 530 or based on a combination or merger of multiple instances of the eviction policies 530. For example, the determination of the entropy zones 578 as a combination of multiple instances of the eviction policies 530 can be calculated as a weighted geometric mean of each of the eviction policies 530.

For the least frequency policy 534, the entropy zones 578 can be based on an average of the activity frequency 556 for the storable objects 414 in the object registry 411. Zone 0 can include the range of the entropy level 574 where half of the average of the activity frequency 556 for the object registry 411 is greater than the activity frequency 556 of the storable objects 414. Zone 1 can include the range of the entropy level 574 where the average of the activity frequency 556 for the object registry 411 is greater than the activity frequency 556 of the storable objects 414. Zone 2 can include the range of the entropy level 574 where the average of the activity frequency 556 for the object registry 411 is less than the activity frequency 556 of the storable objects 414. Zone 3 can include the range of the entropy level 574 where double the average of the activity frequency 556 for the object registry 411 is less than the activity frequency 556 of the storable objects 414.

For the least recent policy 532, the entropy zones 578 can be based on a list of the activity frequency 556 for the storable objects 414 in the object registry 441. Zone 0 can include the range of the entropy level 574 at zero percentile of the list from the tail of the list, or zero percentile up to the 25 percentile. Zone 1 can include the range of the entropy level 574 at 25 percentile of the list from the tail of the list, or the 25 percentile up to the 50 percentile. Zone 2 can include the range of the entropy level 574 at 50 percentile of the list from the tail of the list, or the 50 percentile up to the 75 percentile. Zone 3 can include the range of the entropy level 574 at 75 percentile of the list from the tail of the list, or the 75 percentile to the 100 percentile.

For the expiration policy 536, the entropy zones 578 can be based on a garbage collection interval which is a frequency of performing a garbage collection operation. Zone 0 can include the range of the entropy level 574 where the sum of the program timestamp 552 and the expiration time 576 is less than the sum of the current time and a minimum garbage collection interval. Zone 1 can include the range of the entropy level 574 where the sum of the program timestamp 552 and the expiration time 576 is less than the sum of the current time and an average garbage collection interval. Zone 2 can include the range of the entropy level 574 where the sum of the program timestamp 552 and the expiration time 576 is less than the sum of the current time and a maximum garbage collection interval. Zone 3 can include the range of the entropy level 574 where the sum of the program timestamp 552 and the expiration time 576 is greater than the sum of the current time and a maximum garbage collection interval.

In the object evictability step 544, the device control unit 152 can identify the invalid objects 516 as the storable objects 414 that have been overwritten or deleted. The invalid objects 516 can have the entropy level 574 of zero. More specifically, since the invalid objects 516 have the entropy level 574 of "zero," the invalid objects 516 can be determined as evictable during the current or upcoming garbage collection operation.

The storable objects 414 that are determined as the evictable objects 412 and the invalid objects 516 can remain within the erase block 420, which is a candidate for a subsequent erase operation. The storable objects 414 that are not identified as the evictable objects 412 or the invalid objects 516 can be identified as the cacheable objects 430. The cacheable objects 430 can be relocated to other instances of the memory blocks 168 in a relocation step 546.

The relocation step 546 is for caching the cacheable objects 430, which are valid instances of the storable objects 414. In the relocation step 546, the device control unit 152 can move the cacheable objects 430 to another instance of the memory block 168 from the erase block 420 prior to the erase operation. As an example, the cacheable objects 430 can be moved to a cache that can be extended for a write cache or moved to an exclusive cache. As another example, the cacheable objects 430 can be moved to instances of the memory blocks 420 based on the entropy level 574 of the cacheable objects 430. More specifically, the cacheable objects can be moved to instances of the memory block 420 such that the entropy level 574 corresponds with the entropy zones 578 associated with the memory block 420.

In the relocation step 546, each of the cacheable objects 430 that have an associated instance of the entropy level 574 can be relocated to an instance of the memory blocks 168 with a corresponding instance of the entropy zones 578. More specifically, for relocation of the cacheable objects 430, the cacheable objects 430 can have the entropy level 574 within the same instance of the entropy zones 578 as that of the storable objects 414 stored in the instance of the memory blocks 168. In other words, the storable objects 414 and the cacheable objects 430 that are relocated to the instance of the memory blocks 168 are of the same instance of the entropy zones 578. For example, the cacheable objects 430 having the entropy level 574 within the instance of the entropy zones 578 of "zone 1" can be moved to an open instance of the memory blocks 168 that has been allocated to store other instances of the storable objects 414 of "zone 1." Similarly, the cacheable objects 430 of the "zone 2" and "zone 3" can be moved to an open instance of the memory blocks 168 that have been allocated to store other instances of the storable objects 414 of "zone 2" and "zone 3," respectively. The open instances refer to the memory blocks 168 that are available for storage of instances of the storable objects 414.

In the relocation step 546, the cache management process 410 can further process new or incoming instances of the storable objects 414, which do not yet have an associated instance of the entropy level 574. For example, the new or incoming instances of the storable objects 414 can be initially stored in staging blocks 520. The staging blocks 520 are specific instances of the memory blocks 168 allocated to store the storable objects 414 that do not yet have an associated value of the entropy level 574. As an example, the staging blocks 520 can be instances of the memory blocks 168 without a value of the block entropy 594. As another example, the staging blocks 520 are not allocated to store the storable objects 414 of a particular instance of the entropy zones 578. The details for handling new instances of the storable objects 414 or instances of the storable objects 414 that do not have a corresponding value of the entropy level 574 will be discussed in detail in FIG. 6, below.

Following the object evictability step 544, the relocation step 546, or a combination thereof, the cache management process 410 can update the object registry 411. For example, the cache management process 410 can implement the registry maintenance step 540 to update the object registry 411 to update the object information 518 for the storable objects 414, such as the cacheable objects 430 that have been relocated to another instance of the memory blocks 168; the evictable objects 412, the invalid objects 516, or a combination thereof that have undergone an erase operation; or a combination thereof.

The device control unit 152 can utilize the memory garbage collector 162 to execute the erase block identification step 548 as described above. Further, the memory garbage collector 162 can communicate with the memory I/O interface 164 to issue an erase command for or perform an erase operation on the erase block 420. Yet further, the device control unit 152 can implement the above steps, such as the registry maintenance step 540, the entropy calculation step 572, the relocation step 546, or a combination thereof, until each of the storable objects 414 in the erase block 420 has been processed. More specifically, each of the steps can be repeated until the cacheable objects 430 have been moved to new instances of the memory block 168, each instance of the erase block 420 has undergone the erase operation, or a combination thereof.

It has been discovered that the eviction policy for self-eviction of the key-value pairs 165 enables a non-volatile memory device, such as the memory device 104, to better function as a caching device.

Figure 6:
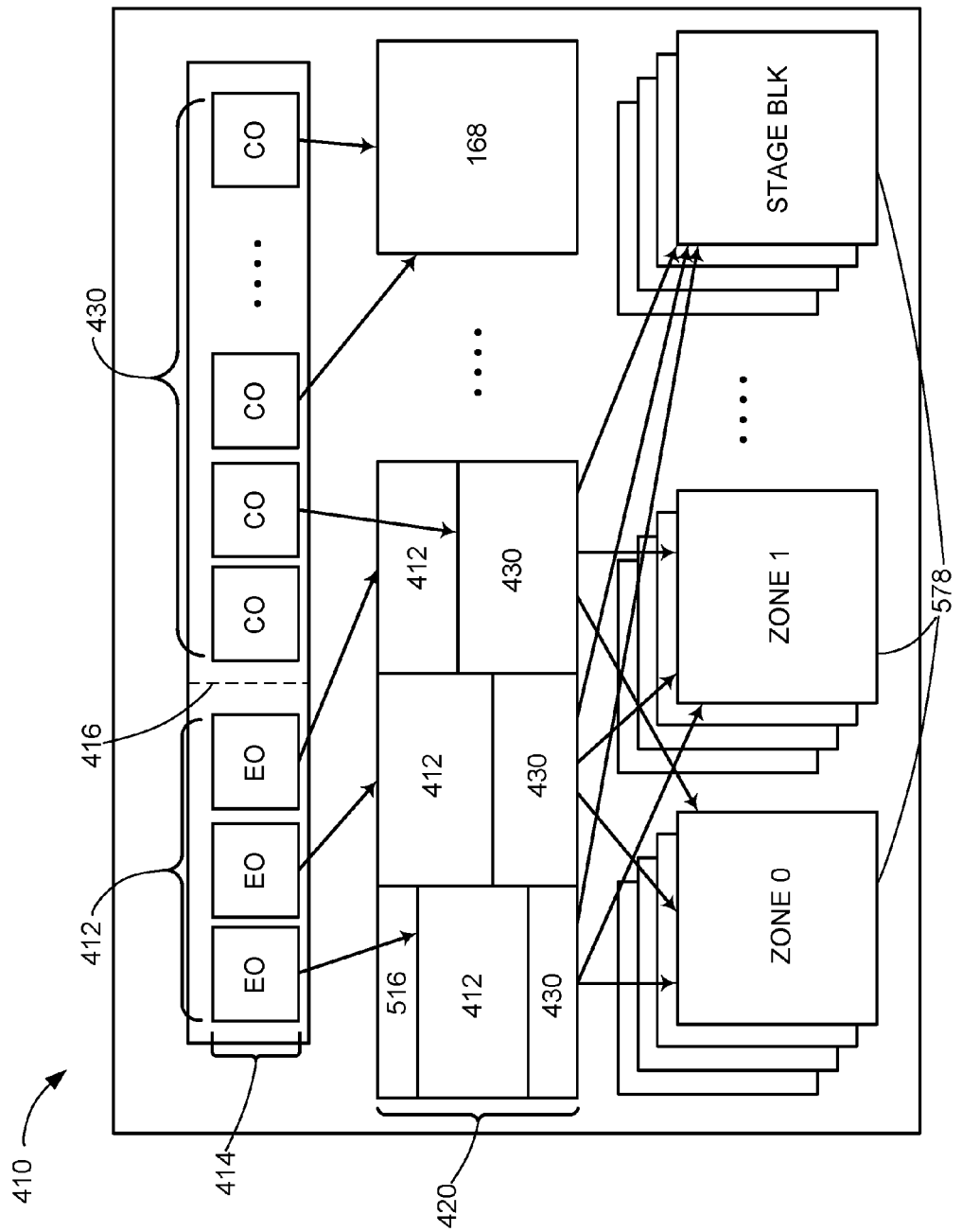
FIG. 6 is a flow chart for a storage operation for the cache management process of FIG. 4.

Referring now to FIG. 6, there in is shown a schematic example of the components for the cache management process of FIG. 4 of the computing system 100. FIG. 6 depicts the evaluation of the storable objects 414 as the evictable objects 412 and the cacheable objects 430 based on the eviction threshold 416.

Each of the memory blocks 168 can include the evictable objects 412, the invalid objects 516, the cacheable objects 430, or a combination thereof. For example, the memory blocks 168 having the lowest relative value of the block entropy 594 of FIG. 5 can include a high number of the invalid objects 516 and the evictable objects 412 comparted to the memory blocks 168 having a high relative value of the block entropy 594, which can include few to no instances of the evictable objects 412 or the invalid objects 516. A number of the memory blocks 168 can be designated as the erase blocks 420 based on the block entropy 578 relative to the other instances of the memory blocks 168. For example, the memory blocks 168 having the lowest relative value of the block entropy 594 can be considered as a candidate for the erase block 420. As a specific example, the number of the memory blocks 168 designated as the erase blocks 420 can be determined based on Quality of Service (QoS) requirements.

Prior to performing an erase operation, the cacheable objects 430 can be relocated from the erase blocks 420 to other instances of memory blocks 168 according to the entropy level 574 of FIG. 5 for the cacheable objects 430. More specifically, the cacheable objects 430 can be relocated to the memory blocks 168 with the entropy level 574 and block entropy 594, respectively, that correspond to the same instance of the entropy zone 578. As an example, the cacheable objects 430 having the entropy level 574 corresponding to the entropy zone 578 of "zone 1" or "zone 2" can be relocated to the memory blocks 168 corresponding to the entropy zone 578 of "zone 1" or "zone 2," respectively. In the specific example of the storable objects 414 that do not have a calculated value of the entropy level 578, such the storable objects 414 that are new or recently received by the memory device 104 or the host storage unit 114, can be relocated to the staging blocks 520 of FIG. 6.

Figure 7:
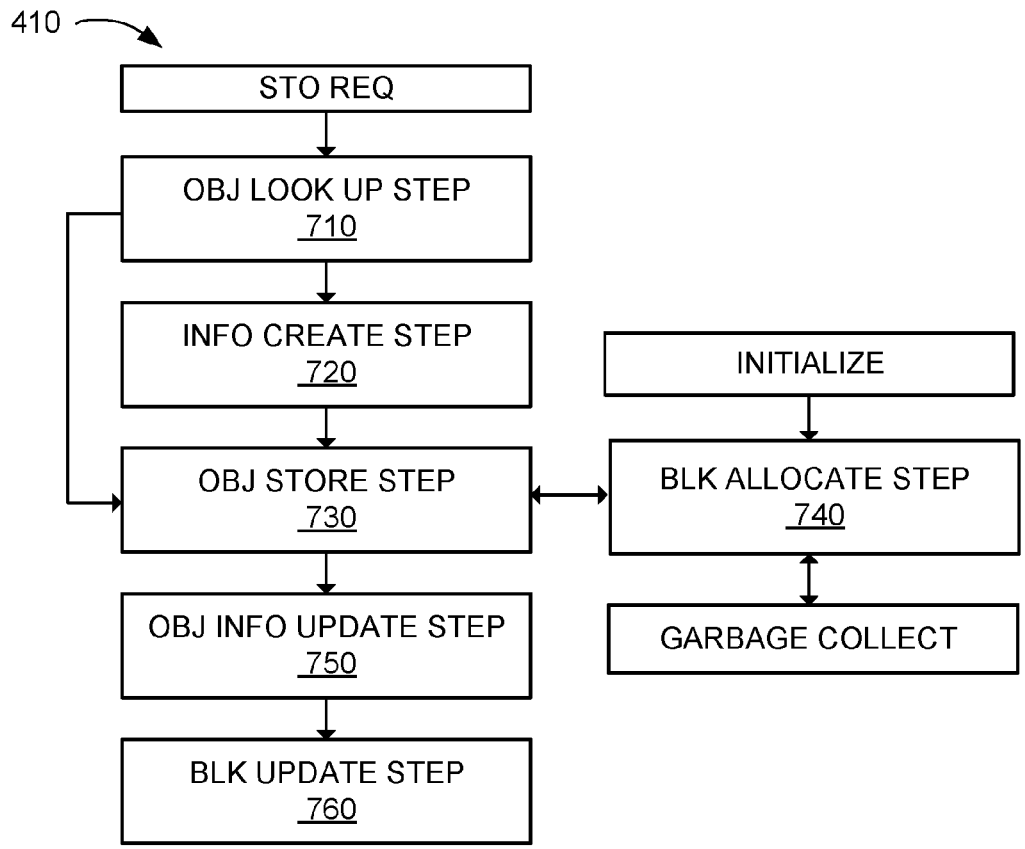
FIG. 7 is a shown a flow chart for a retrieval operation for the cache management process of FIG. 4.

Referring now to FIG. 7, therein is shown a flow chart for a storage operation for the cache management process 410 of FIG. 4. During initialization of the host device 102, the memory device 104, or a combination thereof, the cache management process 410 can designate each of the memory blocks 168 as free instances of the memory blocks 168. The free instances of the memory blocks 168 are not yet associated with a particular instance of the entropy zones 578 of FIG. 5. A portion of the free instances of the memory blocks 168 can be allocated as the staging blocks 520 of FIG. 5. The staging blocks 520 are an instance of the memory blocks 168 that does not have a corresponding value of the block entropy 594 or assigned to an instance of the entropy zones 578.

The flowchart can begin the storage operation based on a command or request to store an instance of the storable objects 414. The cache management process 410 can process the request or command in an object look up step 710. In the object look up step 710, a search can be conducted through the object registry 411 of FIG. 4 for the object information 518 of FIG. 5 corresponding to the storable objects 414 of FIG. that is the target of the storage operation.

In the situation where the object information 518 for the storable objects 414 is not found in the object registry 411, such as when the storable objects 414 are a new or incoming instance of the storable objects 414 for storage on the memory device 104 of FIG. 1 or the host storage unit 114 of FIG. 1, the cache management process 410 can proceed to an information creation step 720. The information creation step 720 is for creating a new instance of the object information 518 corresponding to the new instance of the storable objects 414. For example, the object information 518 can be generated to include the program timestamp 552 of FIG. 5, the activity log 554 of FIG. 5, the object size 560 of FIG. 5, or a combination thereof for the new instance of the storable objects 414.

Once the object information 518 for the new instance of the storable objects 414 is created in the information creation step 720, or if the object information 518 is found in the object registry 411 in the object look up step 710, the cache management process 410 can determine whether the staging blocks 520 are available for the storage operation. In the case where free instances of the memory blocks 168 are unavailable for storage of the storable objects 414, the cache management process 410 can initiate the garbage collection process, including the erase block identification step 548 of FIG. 5 and associated steps of FIG. 5, to generate free instances of the memory blocks 168. The newly generated free instances of the memory blocks 168 can be allocated for storage of the new instances of the storable objects 414 in a block allocation step 740 as the staging blocks 520. Furthermore, the free instances of the memory blocks 168 can be allocated according to the entropy zones 578. For example, free instances of the memory blocks 168 can be allocated to store the storable objects 414, the cacheable objects 430, or a combination thereof corresponding to one of the entropy zones 578 when the number of the memory blocks 168 associated with the particular instance of the entropy zones 578 is insufficient to store the storable objects 414 of the same instance of the entropy zones 578.

Once the free instances of the memory blocks 168 are generated in the block allocation step 740 or in the situation where the free instances of the memory blocks 168 are available for allocation as the staging blocks 520, the storage operation can proceed to an object storage step 730. In the object storage step 730, the cache management process 410 can store the new or incoming instances of the storable objects 414. In one implementation, the new or incoming instances of the storable objects 414 received by the memory device 104 or the host storage unit 114 can be stored in the staging blocks 520. In another implementation, the new or incoming instances of the storable objects 414 received by the memory device 104 or the host storage unit 114 can be initially stored in an arbitrary instance of the memory blocks 420, regardless of the particular instance of entropy zones 578 associated with the memory blocks 168, and subsequently moved once the entropy level 574 of FIG. 5 is calculated for the storable objects 414.

After the storable objects 414 have been stored, the storage operation can proceed to an object information update step 750 and a block information update step 760. In the object information update step 750, the cache management process 410 can update object information 518 in the object registry 411, including the program timestamp 552, the activity log 554, the object size 560, or a combination thereof. Similarly, in the block information update step 760, the cache management process 410 can update information associated with the memory blocks 168, such as the block entropy 594, and other information associated with the storable objects 414 in the memory blocks 168.

Figure 8:
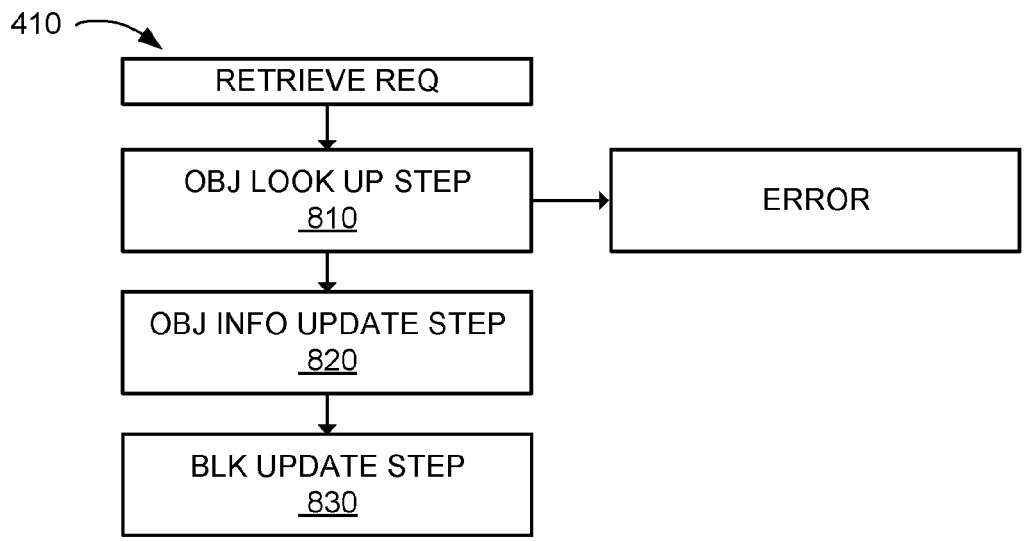
FIG. 8 is a schematic example of the components for the cache management process of FIG. 4 of the computing system.

Referring now to FIG. 8, therein is shown a flow chart for a retrieval operation for the cache management process 410 of FIG. 4. The retrieve operation can be initialized by a command or request to access the storable objects 414 of FIG. 4 on the memory device 104 of FIG. 1 or the host storage unit 114 of FIG. 1. The flowchart can begin the retrieval operation based on a command or request to access an instance of the storable objects 414.

The cache management process 410 can process the request or command in an object look up step 810. In the object look up step 810, a search can be conducted through the object registry 411 of FIG. 4 for the instance of the storable objects 414 of FIG. 4 that is the target of the retrieval operation, the object information 518 of FIG. 5 corresponding to the storable objects 414, or a combination thereof. In the event that the requested instance of the storable objects 414 is not found, the cache management process 410 can generate an error notification.

After the requested instance of the storable objects 414 has been found and the retrieval request has been fulfilled, the retrieve operation can proceed to an object information update step 820 and a block information update step 830. In the object information update step 820, the cache management process 410 can update object information 518 in the object registry 411, such as the activity log 554, including the activity frequency 556 of FIG. 5, the recent activity 558 of FIG. 5, the object size 560, the expiration time, or a combination thereof. Similarly, in the block information update step 830, the cache management process 410 can update information associated with the memory blocks 168, such as the block entropy 594, and other information associated with the storable objects 414 in the memory blocks 168.

Figure 9:
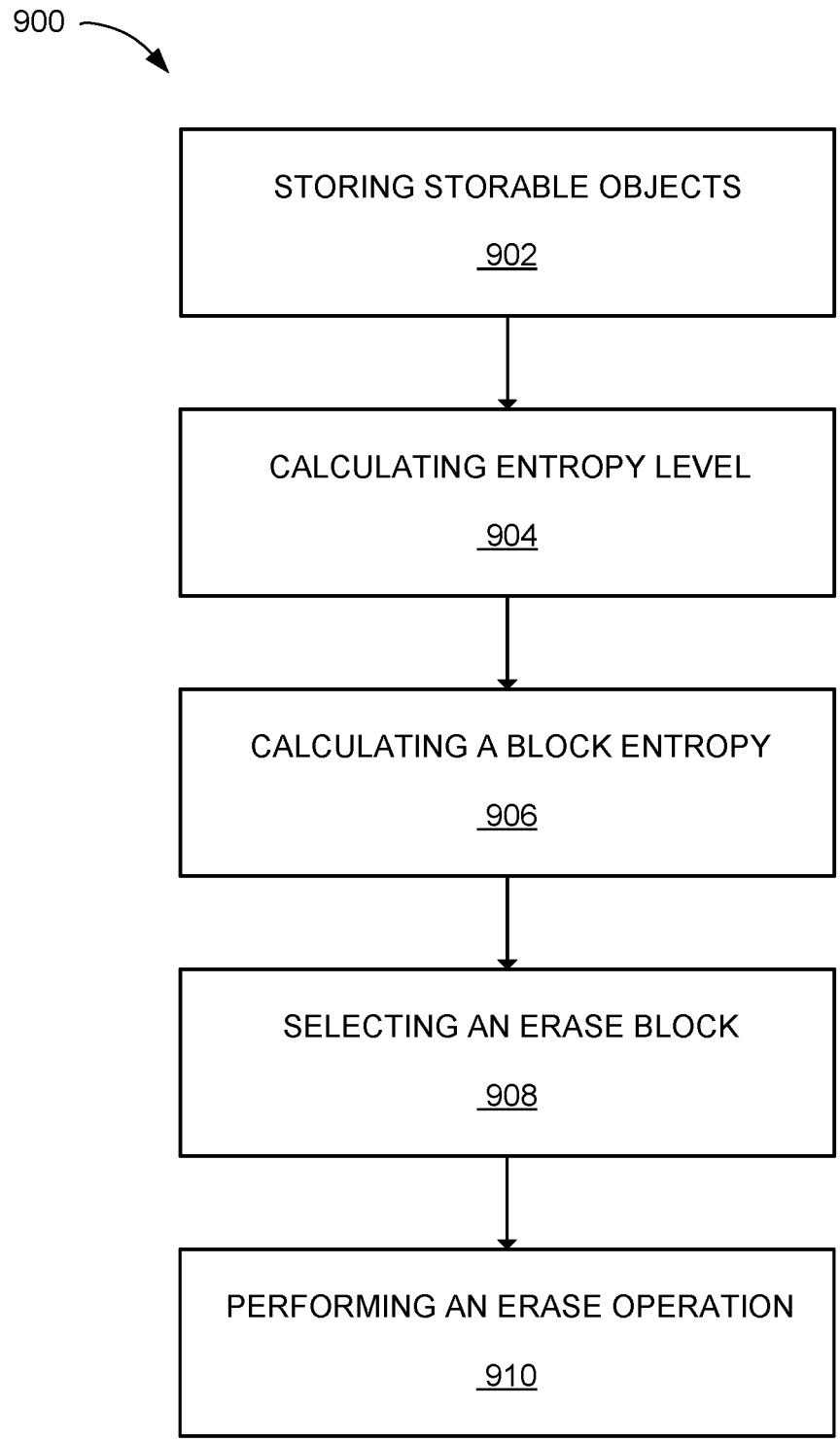
FIG. 9 is a flow chart of a garbage collection operation for the cache management process of FIG. 4.

Referring now to FIG. 9, therein is shown a flow chart of a method 900 of operation of a computing system 100 in an embodiment of the present invention. The method 900 includes: storing storable objects in memory blocks of a memory storage unit, the memory storage unit configured as a memory cache in a block 902; calculating an entropy level for the storable objects based on an eviction policy in a block 904; calculating a block entropy for each of the memory blocks based on the entropy level of the storable objects stored in the memory blocks in a block 906; selecting an erase block from the memory block, wherein the erase block is an instance of the memory blocks with the lowest value of the block entropy in a block 908, and performing an erase operation on the erase block in a block 910. The blocks of the method 900 can be implemented by units of the memory device 104 of FIG. 1, such as the device control unit 152 of FIG. 1 and the memory storage unit 154 of FIG. 1 as described in the flows of FIG. 3 above, FIG. 5 above, FIG. 7 above, FIG. 8 above, or a combination thereof. For example, the method of block 902 can be implemented by device control unit 152 through the memory I/O interface 164 of FIG. 1.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization. Another important aspect of an embodiment of the present invention is that it valuably supports and services the historical trend of reducing costs, simplifying systems, and increasing performance.

These and other valuable aspects of an embodiment of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A computing system comprising:
    a memory storage unit, having memory blocks, configured as a memory cache to store storable objects; and
    a device control unit, coupled to the memory storage unit, configured to:
    calculate an entropy level for the storable objects based on an eviction policy;
    calculate a block entropy for each of the memory blocks based on the entropy level of the storable objects in the memory blocks;
    select an erase block from the memory blocks, wherein the erase block is an instance of the memory blocks with the lowest value of the block entropy; and
    perform an erase operation on the erase block.

2. The system as claimed in claim 1 wherein the device control unit is configured to calculate the entropy level based on the eviction policy including a least recent policy.

3. The system as claimed in claim 1 wherein the device control unit is configured to calculate the entropy level based on the eviction policy including a least frequent policy.

4. The system as claimed in claim 1 wherein the device control unit is configured to calculate the entropy level based on the eviction policy including an expiration policy.

5. The system as claimed in claim 1 wherein the device control unit is configured to initiate unsolicited initiation of selection of the erase block and performance of the erase operation on the erase block.

6. The system as claimed in claim 1 wherein the device control unit is configured to maintain an object registry of the storable objects including a program timestamp, an activity log, or a combination thereof for each of the storable objects in the object registry.

7. The system as claimed in claim 1 wherein the device control unit is configured relocate cacheable objects from the erase block to a further instance of the memory blocks prior to performing of the erase operation, wherein the further instance of the memory blocks for relocation of the cacheable objects is determined based on an entropy zone of the storable objects stored on the further instance of the memory blocks.

8. The system as claimed in claim 1 wherein the device control unit is configured select the erase block based on an average or median value of the entropy level for the storable objects associated with one of the memory blocks.

9. The system as claimed in claim 1 wherein the device control unit is configured to allocate staging blocks for storage of incoming or new instances of the storable objects.

10. The system as claimed in claim 1 wherein the device control unit is configured to categorize the storable objects into an entropy zone based on the entropy level.

11. A method of operation of a computing system comprising:
    storing storable objects in memory blocks of a memory storage unit, the memory storage unit configured as a memory cache;
    calculating an entropy level for the storable objects based on an eviction policy;
    calculating a block entropy for each of the memory blocks based on the entropy level of the storable objects stored in the memory blocks;
    selecting an erase block from the memory blocks, wherein the erase block is an instance of the memory blocks with the lowest value of the block entropy, and performing an erase operation on the erase block.

12. The method as claimed in claim 11 wherein calculating the entropy level based on an eviction policy includes calculating the entropy level based on a least recent policy.

13. The method as claimed in claim 11 wherein calculating the entropy level based on an eviction policy includes calculating the entropy level based on a least frequent policy.

14. The method as claimed in claim 11 wherein calculating the entropy level based on an eviction policy includes calculating the entropy level based on an expiration policy.

15. The method as claimed in claim 11 further comprising initiating unsolicited initiation of selecting the erase block and performing the erase operation on the erase block.

16. The method as claimed in claim 11 further comprising maintaining an object registry of the storable objects including a program timestamp, an activity log, or a combination thereof for each of the storable objects in the object registry.

17. The method as claimed in claim 11 further comprising relocating cacheable objects from the erase block to a further instance of the memory blocks prior to performing of the erase operation, wherein the further instance of the memory blocks for relocation of the cacheable objects is determined based on an entropy zone of storable objects stored on the further instance of the memory blocks.

18. The method as claimed in claim 11 wherein selecting the erase block includes selecting the erase block based on an average or median value of the entropy level for the storable objects associated with one of the memory blocks.

19. The method as claimed in claim 11 further comprising allocating staging blocks for storage of incoming or new instances of the storable objects.

20. The method as claimed in claim 11 further comprising categorizing the storable objects into entropy zones for the storable objects based on the entropy level.

* * * * *